United States Patent [19]

Galbraith et al.

[11] Patent Number: 5,130,777
[45] Date of Patent: Jul. 14, 1992

[54] APPARATUS FOR IMPROVING ANTIFUSE PROGRAMMING YIELD AND REDUCING ANTIFUSE PROGRAMMING TIME

[75] Inventors: Douglas C. Galbraith, Fremont; Steve S. Chiang, Saratoga; Abdelshafy A. Eltoukhy, San Jose; Esmat Z. Hamdy, Fremont, all of Calif.

[73] Assignee: Actel Corporation, Sunnyvale, Calif.

[21] Appl. No.: 638,517

[22] Filed: Jan. 4, 1991

[51] Int. Cl.$^5$ ............................................. H01L 27/02
[52] U.S. Cl. ....................................... 357/51; 357/13; 365/96; 365/225.7
[58] Field of Search ............... 357/51, 13, 45; 365/96, 365/225.6, 225.7, 175, 189.06, 203

[56] References Cited

U.S. PATENT DOCUMENTS

| | | | |
|---|---|---|---|
| 3,582,908 | 6/1971 | Koo | 365/96 |
| 4,507,757 | 3/1985 | McElroy | 365/96 |
| 4,569,120 | 2/1986 | Stacy et al. | 357/2 |
| 4,605,872 | 8/1986 | Rung | 357/43 |
| 4,638,243 | 1/1987 | Chan | 365/96 |
| 4,646,264 | 2/1987 | Matsuzaki | 365/96 |
| 4,914,055 | 4/1990 | Gordon et al. | 357/67 |

Primary Examiner—Andrew J. James
Assistant Examiner—Sara W. Crane
Attorney, Agent, or Firm—Kenneth D'Alessandro

[57] ABSTRACT

The present invention includes four approaches to reduce the unintended programming of antifuses while programming selected antifuses and to decrease the programming time. The first approach includes circuitry to maintain the voltage placed on unselected antifuses at a constant level by use of a voltage source. According to the second approach, a resistor is included in series with the voltage source. According to the third approach, a diode is included in series with the voltage source. According to the fourth approach, a MOS implementation of a diode is included in series with the voltage source.

5 Claims, 2 Drawing Sheets

APPARATUS FOR IMPROVING ANTIFUSE PROGRAMMING YIELD AND REDUCING ANTIFUSE PROGRAMMING TIME

BACKGROUND OF THE INVENTION

1. Field of the Invention

The present invention relates to electrically programmable antifuses for use in integrated circuits. More specifically, the present invention relates to circuitry for programming an array of antifuses which avoids inadvertently programming unselected antifuses.

2. The Prior Art

A typical antifuse structure contains an insulating dielectric material sandwiched between two conductive electrodes. When programming one antifuse in an array of antifuses, protecting other unprogrammed antifuses from being accidentally programmed is a very important consideration.

In a PROM (programmable read only memory) array where every antifuse is in series with one transistor, the antifuse to be programmed is selected by turning on the transistor in series with the antifuse. All other transistors remain turned off. However, substrate leakage current generated during the programming of one selected antifuse may cause other antifuses to be programmed unintentionally.

The problem becomes more difficult when a plurality of antifuses are used as programmable interconnect elements in a gate array structure where no active transistors are placed in series with the individual antifuses. When utilized in such an array as an interconnect element, the antifuse to be programmed is selected by applying a programming voltage ($V_{pp}$) across the antifuse electrodes. The voltage drop $V_{pp}$ across the antifuse will cause the antifuse dielectric to rupture, forming a conducting path between the two electrodes.

To protect antifuses which are intended to remain unprogrammed, a dynamic precharge step may be used to place a voltage, $V_{pre}$, equal to approximately $V_{pp}/2$, on all other nodes so that the ideal voltage drop across an antifuse which is to remain unprogrammed is $V_{pp}/2$ during programming of a selected antifuse. The voltage value of $V_{pre}$ is selected as $V_{pp}/2$ so that the unprogrammed antifuse will not be programmed.

In the real-world circuit implementation, the actual precharge voltage applied may not be $V_{pp}/2$ but may be based on an optimization scheme that balances the overall voltage stress on the unprogrammed antifuses. This is necessary because in the real circuit operation, the $V_{pp}/2$ voltage, which is a dynamic precharged voltage rather than an actively applied voltage, cannot be held constant. One reason is that high voltage $V_{pp}$ may induce field transistor leakage or N+ junction leakage which results in changes in the precharged voltage value. This leakage will cause additional stress on the antifuses to remain unprogrammed and will result in a higher probability of unintended antifuse programming.

Another reason that the dynamic voltage $V_{pp}/2$ may change is because of capacitive coupling between metal lines. For example, if a metal line switches between 0V and $V_{pp}$, it will capacitively couple to the adjacent lines. If these lines are dynamically precharged to a voltage such as $V_{pp}/2$, the capacitive coupling will alter their precharged voltage.

One approach to reduce the field transistor leakage current is to apply a source bias voltage $V_{sb}$ to the field transistor to increase its threshold voltage, $V_t$, and thereby reduce its leakage current. This is the approach adopted for the Act 10XX product family of integrated circuits manufactured by Actel Corporation, assignee of the present patent application.

There are two limitations to using the source bias approach. The first is that source bias does not control the junction leakage current. Therefore, every junction has to be pre-stressed to ensure the integrity, and yield loss is inevitable. Another limitation is that when source bias is used, the antifuse programming voltage is dropped from $V_{pp}$ ($V_{pp}$-0) to $V_{pp}$-$V_{sb}$. Reducing the programming voltage increases the programming time. When the integrated circuit containing the antifuses is small, the additional programming time may be tolerated. However, as the number of antifuses on the integrated circuit increases, the number of antifuses to be programmed also increases. At some point, the increase in density becomes so great that the corresponding increase in programming time becomes unacceptable.

BRIEF DESCRIPTION OF THE INVENTION

According to the present invention, four approaches are implemented to reduce the unintended programming of antifuses while programming selected antifuses and to decrease the programming time. The first approach includes circuitry to maintain the voltage placed on unselected antifuses at a constant level by use of a voltage source. According to the second approach, a resistor is included in series with the voltage source. According to the third approach, a diode is included in series with the voltage source. According to the fourth approach, a MOS implementation of a diode is included in series with the voltage source.

The present invention is directed to improving the antifuse programming yield without the penalty of increasing the antifuse programming time. According to the present invention, the full programming voltage $V_{pp}$ is placed across the antifuse to be programmed rather than reducing the programming voltage by the source bias voltage to $V_{pp}$-$V_{sb}$. This shortens the programming time. The voltage placed across unselected antifuses is regulated by the circuits disclosed herein to limit voltage variations and compensate for leakage currents by a predetermined amount.

DETAILED DESCRIPTION OF A PREFERRED EMBODIMENT

Figure 1:
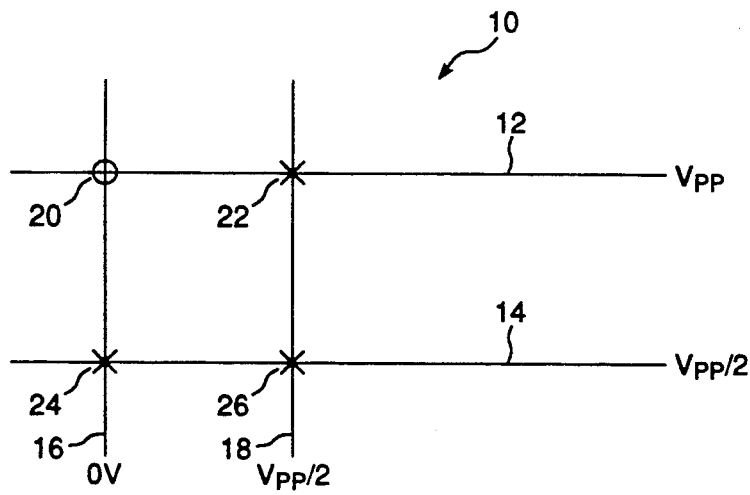
FIG. 1 is a schematic diagram of the environment in which the present invention functions, showing a portion of an antifuse array.

FIG. 1 is a schematic diagram of the environment in which the present invention functions, showing a portion of an antifuse array using prior art programming techniques. FIG. 1 shows how unselected antifuses may be accidentally programmed during programming of a selected antifuse.

In FIG. 1, a portion of an antifuse array 10 is disclosed. Row lines 12 and 14 intersect column lines 16 and 18 at intersections. Antifuse 20 is located at the intersection of row line 12 and column line 16. Antifuse 22 is located at the intersection of row line 12 and column line 18. Antifuse 24 is located at the intersection of row line 14 and column line 16. Antifuse 26 is located at the intersection of row line 14 and column line 18.

To program antifuse 20, a programming voltage $V_{pp}$ is placed across the antifuse. For example, row line 12 may be brought to $V_{pp}$ and column line 16 may be grounded. The stress caused by $V_{pp}$ on the antifuse dielectric is enough to rupture the dielectric and form a conductive path from row line 12 to column line 16.

If it is desired that antifuses 22, 24, and 26 remain unprogrammed, the voltages on row line 14 and column line 18 must be controlled to prevent stressing of the dielectrics associated with these antifuses. Under ideal conditions, antifuses 22, 24 and 26 should have a voltage, preferably equal to about $V_{pp}/2$, across them. This voltage may be provided by precharging row line 14 and column line 18 to $V_{pp}/2$ before $V_{pp}$ is applied to row line 12. During programming of antifuse 20, the nodes precharged to $V_{pp}/2$ are floating because there is no applied voltage source to maintain the voltage at these levels. This precharged voltage is thus susceptible to decay due to leakage currents.

Figure 2:
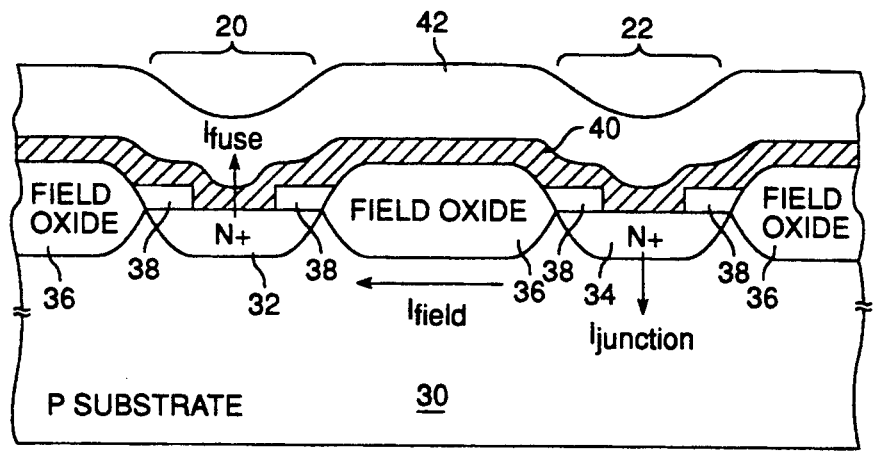
FIG. 2 is a cross section of a semiconductor structure containing an antifuse structure demonstrating the mechanisms which may deleteriously alter a dynamic precharged voltage placed on a node to protect antifuses to remain unprogrammed.

There are several sources of leakage currents in the physical structures comprising and surrounding antifuses in a semiconductor circuit such as that of FIG. 1. Three of these mechanisms are shown in FIG. 2. FIG. 2 is a cross sectional view of a semiconductor structure containing an antifuse structure and is useful for demonstrating the mechanisms which may deleteriously alter a dynamic precharged voltage placed on a node.

In FIG. 2, antifuses 20 and 22 are shown formed in and over p-type semiconductor substrate 30. N+ region 32 forms the lower electrode of antifuse 20, and N+ region 34 forms the lower electrode of antifuse 22. Field oxide regions 36 serve to isolate the antifuses 20 and 22 from each other and from other diffused structures in substrate 30. Insulating layer 38, formed on the surface of semiconductor substrate 30 has window areas above N+ regions 32 and 34 in which antifuse dielectric layer 40 is formed. Polysilicon layer 44 is formed over the surface of insulating layer 38 and antifuse dielectric layer 40 and forms row line 12, the common upper electrode for antifuses 20 and 22.

In the structure depicted in FIG. 2, a precharged dynamic voltage present at N+ region 34 is susceptible to decay via several distinct and separate mechanisms. One, indicated by the current symbol $I_{junction}$, is the N+ reverse-biased junction leakage (due to the presence of $V_{pp}/2$). A second, indicated by the current symbol $I_{field}$ is field transistor leakage due to the presence of $V_{pp}$ on polysilicon line 42, which acts as a gate element, and the voltage $V_{pp}/2$ on N+ region 34 and 0 volts on N+ region 32 (which act as the drain and source, respectively, of the field transistor). A third is leakage through the antifuse itself, as indicated by the current symbol $I_{fuse}$. This third mechanism is most likely to play a part in degradation of the voltage $V_{pp}/2$ in antifuses utilizing amorphous silicon, where antifuse leakage currents may be substantially higher than in other antifuse structures, but may be present in antifuse structures not employing amorphous silicon. In addition, other mechanisms, such as MOS subthreshold leakage, can contribute to the voltage decay.

These leakage currents illustrated with respect to FIG. 2 will cause the dynamically impressed precharge voltage to decay. If the decay is large enough, it could cause antifuse 22 to be accidentally programmed.

One prior art technique to avoid yield loss by inadvertent programming of antifuses takes into account the current leakage mechanisms and their magnitudes when choosing the precharge voltage. The worst-case voltage variations as a result of field transistor leakage, junction leakage, metal line capacitive coupling variations (and any other mechanism which would alter the charge stored or the pre-charged node) are determined and used to set the value of the precharge voltage.

Another method for preventing antifuses from being accidentally programmed is to apply a positive source-bias voltage, $V_{sb}$ during the programming of a antifuse 20. This method is effective in reducing the field transistor leakage, but not without cost. The application of source bias reduces the total programming voltage on the antifuse 20 by the amount of the source-bias voltage. This will result in an increase in programming time. Where the product to be programmed is a high-density programmable gate array product having many antifuses to be programmed, source bias is not the preferred approach because it creates unacceptably long programming times.

According to a presently preferred embodiment of the invention, the stress voltage ($V_{pre}$) on the unprogrammed antifuses is controlled. Several examples of the circuits which can accomplish this goal while retaining the full $V_{pp}$ on the antifuse to be programmed are shown in FIGS. 3 through 6.

Figure 3:
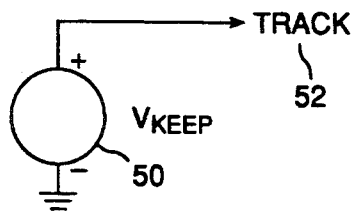
FIG. 3 is a block diagram of a first voltage source circuit according to the present invention disposed on a semiconductor substrate along with an antifuse array for actively maintaining an intermediate voltage during an antifuse programming cycle to protect antifuses which are to remain unprogrammed.

In the first circuit according to the present invention, shown in FIG. 3, a voltage supply $V_{keep}$ 50, set at a voltage of about $V_{pp}/2$, is connected to track 52. Track 52 is a conductor, such as a polysilicon line, an N+ diffusion region, etc., common to a plurality of antifuses to remain unprogrammed. The power supply 50 is designed to maintain the voltage applied to antifuses connected to track 52 to remain unprogrammed within certain limits. A presently preferred limit is ±0.2V. Power supply 50 may consist of any means of producing a low impedance connection to a power supply, including operational amplifiers, source followers, pass gates connected to a power supply, or direct connections to a power supply.

Figure 4:
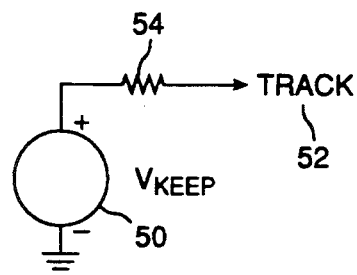
FIG. 4 is a block diagram of a second voltage source circuit in series with a resistor according to the present invention disposed on a semiconductor substrate along with an antifuse array for actively maintaining an intermediate voltage during an antifuse programming cycle to protect antifuses which are to remain unprogrammed.

A second circuit according to the present invention, shown in FIG. 4, adds a resistor 54 in series with power supply 50 and track 52. The value of resistor 54 should be chosen to limit the current through power supply 50 to about 1 to 100 μA, preferably around 20 μa.

The circuit of FIG. 4 is superior to the circuit of FIG. 3 because the circuit of FIG. 3 may allow excessive amounts of current to flow through the voltage source $V_{keep}$ when the track is raised to $V_{pp}$ for programming. Inclusion of resistor 54 in series with power supply 50 solves this problem by limiting the current which may be caused to flow through power supply 50.

Figure 5:
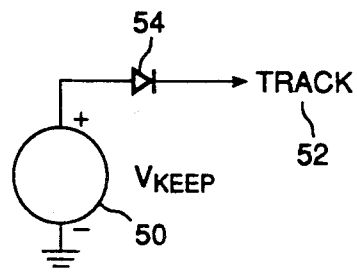
FIG. 5 is a block diagram of a third voltage source circuit in series with a diode according to the present invention disposed on a semiconductor substrate along with an antifuse array for actively maintaining an intermediate voltage during an antifuse programming cycle to protect antifuses which are to remain unprogrammed.

The third circuit, shown in FIG. 5, includes a diode 56 in series with the power supply 50. Diode 56 may be located between the external power supply which supplies $V_{pp}/2$ to the integrated circuit via an I/O pad, or may be included as an MOS diode inside the chip. The circuit of FIG. 5 is superior to the circuits of FIGS. 3 and 4, which draw the same amount of current from power supply 50 regardless of whether the output voltage is raised or lowered from $V_{pp}/2$. Ideally, no current would be drawn when the antifuse voltage is raised, since that is the polarity applied during programming. Conversely, a large amount of current would be drawn if the voltage is lowered. Except for capacitive coupling, voltage degradation is the result of most leakage currents.

The diode configuration circuitry of FIG. 5 supplies a large current for reduced voltage and no current for increased voltage. Diode 56 prevents the programming voltage $V_{pp}$ from forcing a current through the $V_{keep}$ voltage source.

Figure 6:
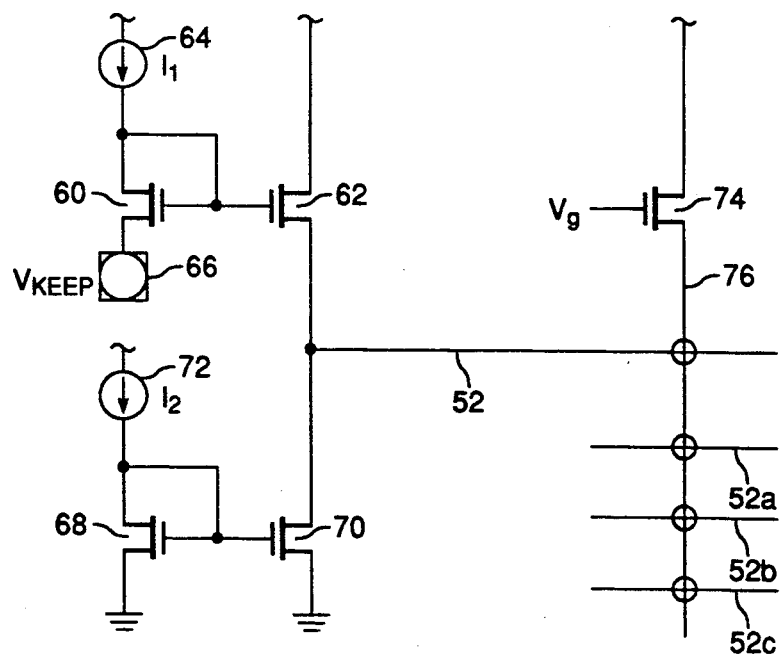
FIG. 6 is a schematic diagram of a preferred embodiment of the third voltage source circuit according to the present invention disposed on a semiconductor substrate along with an antifuse array for actively maintaining an intermediate voltage during an antifuse programming cycle to protect antifuses which are to remain unprogrammed.

The fourth circuit, shown in FIG. 6, is presently preferred practical implementation of the circuit of FIG. 5, and compensates for leakage currents having magnitudes as high as 20μA.

The circuit of FIG. 6 contains a first current mirror including transistors 60 and 62. The gates of transistors 60 and 62 are connected together and to the drain of transistor 60. The drain of transistor 60 is connected to current source 64. Current source 64 may be a current mirror, a resistor, or an externally-supplied current source.

The source of transistor 60 is connected to a source of voltage $V_{keep}$, preferably equal to $V_{pp}/2$ and preferably supplied externally through an I/O pad 66 on the integrated circuit. The layouts of transistors 60 and 62 are matched so that their threshold voltages and gains will track one another with process variations. This parameter tracking ensures that the voltage output to the track 52 at the source of transistor 62, which is placed on the antifuses to remain unprogrammed, closely matches the voltage on the source of transistor 60.

The voltage on the track 52 will vary with current drawn from transistor 60. In a presently preferred embodiment of the invention where the values of 0.5 μA and 20 μA are assumed as the range of leakage currents over which the circuit of the present invention will function, transistor 62 should be sized to limit the voltage variation to the value needed for the particular design. The voltage will be higher if a leakage current of 0.5 μA is drawn than it will be if 20 μA is drawn. Current source 64 is preferably set such that the voltage on I/O pad 66 is set to be midway between the high and low values of track voltages, namely $V_{pp}$ and zero volts, thereby minimizing the worst case variation between the I/O pad 66 and the track 52. The current $i_1$ from current source 64 can be expressed by the following equation:

$$i_1 \approx .25 \, [\sqrt{20\mu a} + \sqrt{0.5\mu a}]^2 \tag{1}$$

where $i_1$ is the current through MOS transistor 60. The values used, 20 μ and 0.5 μA are example currents. Other values are possible.

Transistors 68 and 70 form a second current mirror. The gates of transistors 68 and 70 are connected to one another and to the drain of transistor 68. The drain of transistor 68 is connected to current source 72. Current source 72 may be a current mirror, a resistor, or an externally-supplied current source. The layouts of transistors 68 and 70 are matched so that their threshold voltages and gains will track one another with process variations. This sizing ensures that the currents through these two devices are as nearly identical as possible.

Transistor 70 draws current from transistor 62 thereby ensuring that transistor 62 is operating near or into its super-threshold region. The current through transistor 70 keeps the voltage on track 52 from drifting too high via sub-threshold conducting in transistor 62. Also, the current through transistor 70 sets the lower limit on the "leakage" current through track 52 (set to 0.5 μA in the above example).

The current drawn by transistor 70 is very small ($\approx 0.5$ μA) so that if many of these devices are connected to a horizontal antifuse segment, they will not cause a significant voltage drop in the pullup device. Such a drop would increase the programming time and also the stress time. Both increases are undesirable.

During programming, many vertical tracks, shown by way of illustrative tracks 52a, 52b, 52c in FIG. 6, can be connected to a horizontal track. In circuit implementations where the vertical tracks are connected to circuits according to the present invention, the horizontal track must pull up against all of the pull down current sources on the previously programmed vertical tracks connected to it.

A pullup device 74, shown in FIG. 6, connected to a horizontal track 76, is used for this purpose. Its gate is tied to a voltage source high enough to allow the device to pass $V_{pp}$. If, for example, 100 vertical tracks are connected to horizontal track 76, the pullup device 74 on the horizontal track must overcome 100 times the pulldown current to raise the voltage for programming. The pullup device 74 behaves like a resistor; if current flows through it, voltage will drop across it. Any current drawn through it can thus reduce the programming voltage, thereby increasing the programming time. Therefore, the magnitude of the pulldown current through transistor 70 is adjusted to be very small (about 0.5 μA) so that even a large number of these currents cannot create a significant voltage drop across the horizontal track pullup circuitry.

The first advantage of the present invention is that, by not applying the source bias $V_{sb}$ on the ground node of the antifuse to be programmed, it allows providing the full $V_{pp}$ across that antifuse. The actual improvement in antifuse programming time with $V_{pp}=0V$ is between about 3 to 100 times better than the antifuse programming time when a source bias $V_{sb}=1 \pm 0.5V$ is used and $V_{pp}$ is between 10 to 25V. While this reduction in time is not significant for products with gate counts below 2,000, the programming time becomes an important issue where gate counts above 2,000 are encountered.

The second advantage of the present invention is that the approach disclosed herein controls the voltage variation and leakage current through the nodes set to the intermediate voltage $V_{pp}/2$. In this way, all the leakage current components and voltage variation components can be controlled.

While a presently-preferred embodiment of the invention has been disclosed, those of ordinary skill in the art will, from an examination of the within disclosure and drawing be able to configure other embodiments of the invention. These other embodiments are intended to fall within the scope of the present invention which is to be limited only by the scope of the appended claims.

What is claimed is:

1. In an integrated circuit containing a first group of antifuses which are to be programmed, each of said antifuses in said first group connected between two conductors, and a second group of antifuses which are to remain unprogrammed, each of said antifuses in said second group connected between two conductors, apparatus for preventing programming of antifuses in said second group while programming antifuses in said first group by applying a programming voltage across said antifuses in said first group of antifuses, including first means for supplying an intermediate voltage to said integrated circuit, said intermediate voltage having a magnitude of about one half the magnitude of said programming voltage;

second means for actively applying said intermediate voltage to at least one of said two conductors connected to each antifuse in said second group of antifuses while said programming voltage is applied across said antifuses in said first group of antifuses.

2. The apparatus of claim 1 wherein said second means is a voltage source.

3. The apparatus of claim 2, further including resistive means in series with said voltage source.

4. The apparatus of claim 2 further including a diode in series with said voltage source.

5. In an integrated circuit containing a first group of antifuses which are to be programmed, each of said antifuses in said first group connected between two conductors, and a second group of antifuses which are to remain unprogrammed, each of said antifuses in said second group connected between two conductors, apparatus for preventing programming of antifuses in said second group while programming antifuses in said first group by applying a programming voltage across said antifuses in said first group of antifuses, including:

means for supplying an intermediate voltage to said integrated circuit, said intermediate voltage having a magnitude of about one half the magnitude of said programming voltage;

an upper current mirror, including first and second upper current mirror transistors, said first upper current mirror transistor having its drain connected to its gate and to a first current source, its source connected to a source of voltage, said voltage having a magnitude equal to about one half of that of said programming voltage, said second upper current mirror transistor having its drain connected to a first fixed voltage source, its gate connected to the gate of said first upper current mirror transistor, its source connected to a node comprising one of said two conductors between which at least one of said antifused in said second group is connected;

a lower current mirror, including first and second lower current mirror transistors, said first lower current mirror transistor having its drain connected to its gate and to a second current source, its source connected to a second fixed voltage source, said second lower current mirror transistor having its drain connected to said node, its gate connected to the gate of said first lower current mirror transistor, its source connected to said second fixed voltage source.

* * * * *